(12) United States Patent
Doogue et al.

(10) Patent No.: US 7,936,164 B2
(45) Date of Patent: May 3, 2011

(54) FOLDING CURRENT SENSOR

(75) Inventors: Michael C. Doogue, Manchester, NH (US); William P. Taylor, Amherst, NH (US); Richard Dickinson, South Boston, MA (US)

(73) Assignee: Allegro Microsystems, Inc., Worcester, MA (US)

( * ) Notice: Subject to any disclaimer, the term of this patent is extended or adjusted under 35 U.S.C. 154(b) by 31 days.

(21) Appl. No.: 12/167,681

(22) Filed: Jul. 3, 2008

(65) Prior Publication Data

US 2010/0001715 A1    Jan. 7, 2010

(51) Int. Cl.
G01R 1/20        (2006.01)
G01R 15/20       (2006.01)
G01R 33/07       (2006.01)

(52) U.S. Cl. .................................. 324/117 H; 324/126
(58) Field of Classification Search .............. 324/117 H, 324/126, 127, 117 R
See application file for complete search history.

(56) References Cited

U.S. PATENT DOCUMENTS

| | | | |
|---|---|---|---|
| 4,675,255 A | 6/1987 | Pfeifer et al. | |
| 5,343,184 A * | 8/1994 | Matsui et al. | 336/92 |
| 5,418,514 A | 5/1995 | Smith et al. | |
| 5,825,175 A * | 10/1998 | Selcuk | 324/117 H |
| 6,005,383 A | 12/1999 | Savary et al. | |
| 6,040,688 A | 3/2000 | Strubin | |
| 6,177,884 B1 | 1/2001 | Hunt et al. | |
| 6,323,636 B1 | 11/2001 | Cattaneo et al. | |
| 6,388,549 B1 | 5/2002 | Lenhard | |
| 6,544,078 B2 | 4/2003 | Palmisano et al. | |
| 6,667,685 B2 | 12/2003 | Wasaki et al. | |
| 6,717,396 B2 * | 4/2004 | Viola | 324/117 R |
| 6,756,776 B2 * | 6/2004 | Perkinson et al. | 324/127 |
| 6,781,359 B2 | 8/2004 | Stauth et al. | |
| 7,265,531 B2 | 9/2007 | Stauth et al. | |
| 7,501,808 B2 * | 3/2009 | Ishihara et al. | 324/117 R |
| 2003/0227285 A1 | 12/2003 | Marasch et al. | |
| 2004/0263151 A1 * | 12/2004 | Zein et al. | 324/126 |
| 2005/0045359 A1 | 3/2005 | Doogue et al. | |
| 2006/0152210 A1 | 7/2006 | Mangtani et al. | |
| 2006/0175674 A1 | 8/2006 | Taylor et al. | |
| 2006/0181263 A1 | 8/2006 | Doogue et al. | |
| 2006/0219436 A1 | 10/2006 | Taylor et al. | |
| 2006/0255797 A1 | 11/2006 | Taylor et al. | |

(Continued)

OTHER PUBLICATIONS http://www.tdk.co.jp/tefe02/e9a15-zcat.pdf, TDK, Clamp Filters For Cable, Sep. 25, 2006, pp. 1-4.

(Continued)

*Primary Examiner* — Roberto Velez
(74) *Attorney, Agent, or Firm* — Daly, Crowley, Mofford & Durkee, LLP

(57) ABSTRACT

The invention provides a current sensor that may be folded over a conductor without the need to sever the conductor or thread the conductor through the current sensor. In one embodiment, the current sensor includes an outer body having a first folding portion and a second folding portion coupled to the first folding portion. The current sensor also includes a soft ferromagnetic body disposed within the outer body comprising a first core element and a second core element. The first and second core elements form a lumen when the first and second folding portions are folded. The lumen is configured to receive a conductor. The current sensor also includes a magnetic field detector to sense a current in the conductor. The magnetic field detector is disposed at least partially between the first and second core elements when the first and second folding portions are folded.

27 Claims, 11 Drawing Sheets

U.S. PATENT DOCUMENTS

| | | |
|---|---|---|
| 2007/0247146 A1 | 10/2007 | Stauth et al. |
| 2007/0252577 A1 | 11/2007 | Preusse |
| 2008/0048643 A1 | 2/2008 | Delevoye et al. |
| 2008/0094162 A1 | 4/2008 | Schaerrer et al. |

OTHER PUBLICATIONS

Chucheng Xiao, Lingyin Zhao, Tadashi Asada, W.G. Odendaal and J.D. Van Wyk, "An Overview of Integratable Current Sensor Technologies", 2003, pp. 1251-1258, Center for Power Electronics Systems, Virginia Polytechnic Institute and State University, Blacksburg, VA, IEEE.

Michael Doogue, Richard Dickinson, Andreas P. Friedrich and William P. Taylor, "An Integrated Hall Effect Based Current Sensor", Proc. Sensor 2005 $12^{th}$ International Conference, vol. II, pp. 295-300, Munich, Germany, May 2005.

Andreas P. Friedrich, "Low Noise, High Bandwidth Linear Hall Effect Sensors for Analog Position and Current Measurements", Proc. Sensor Conference 2007, Nurnberg, Germany, pp. 51-56, May 2007.

* cited by examiner

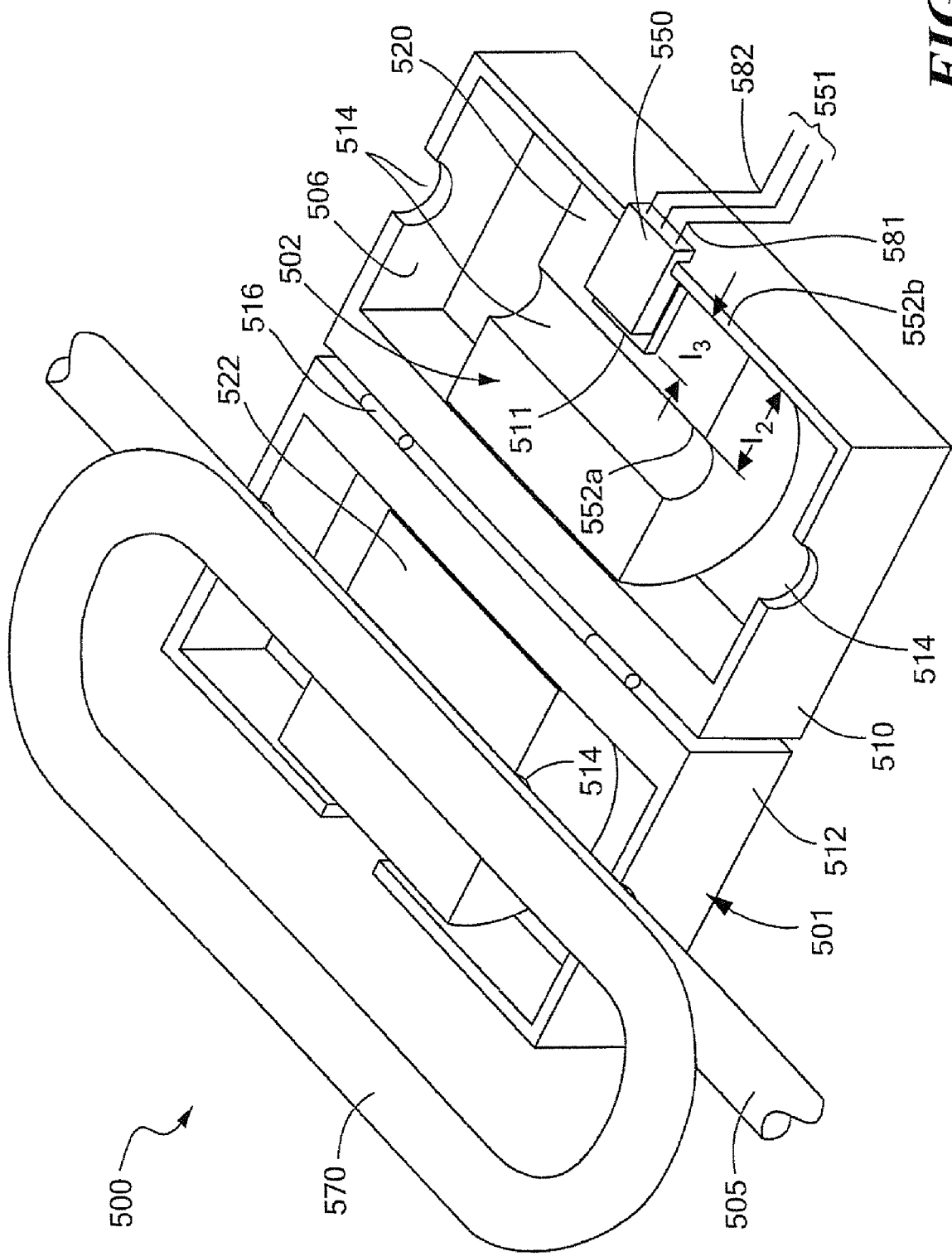

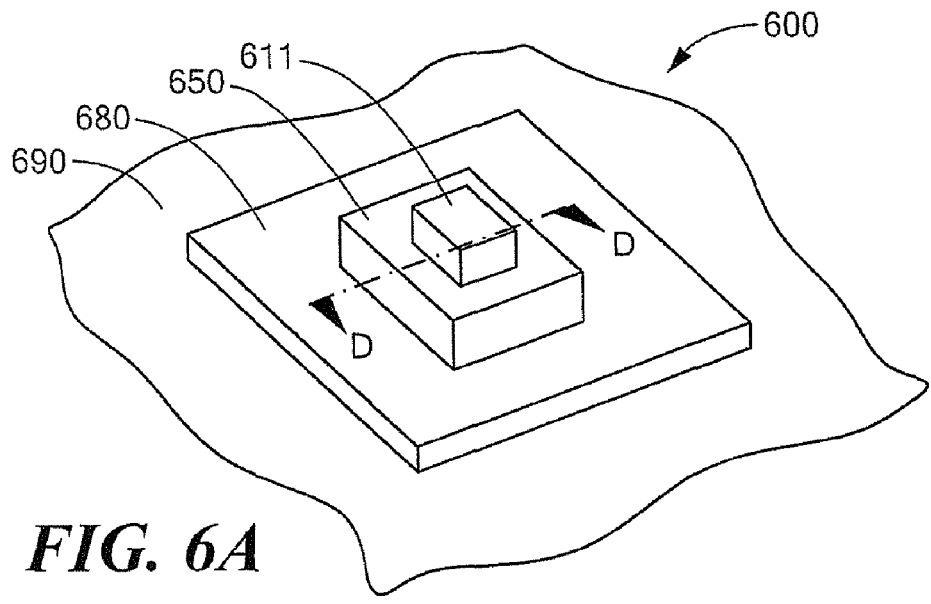
*FIG. 6A*
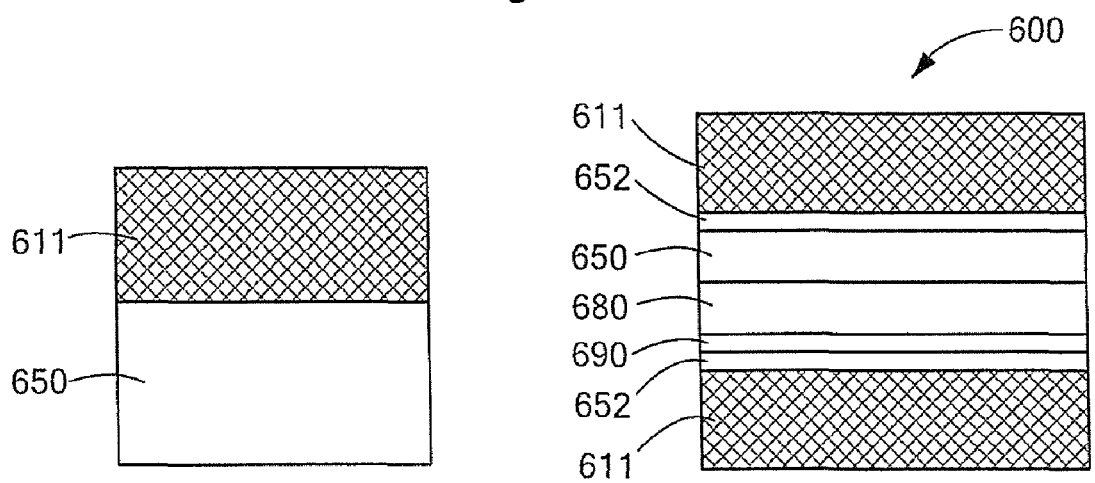
*FIG. 6B*  *FIG. 6C*
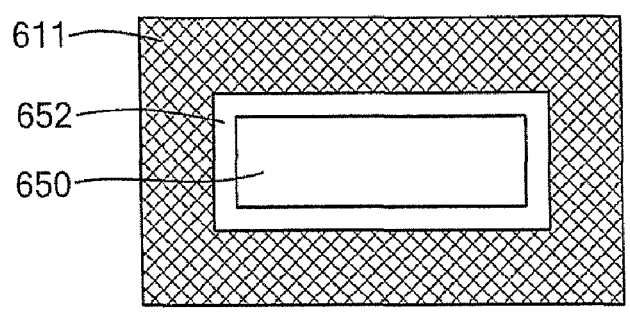
*FIG. 6D*

FOLDING CURRENT SENSOR

FIELD OF THE INVENTION

This invention generally relates to current sensors which use magnetic field transducers to sense current in a conductor. In particular, the invention includes a magnetic field transducer placed between folding sections of a soft ferromagnetic core to sense current in a conductor.

BACKGROUND

As is known in the art, conventional current sensors may use a magnetic field transducer (for example, a Hall effect element) in proximity to an electrical conductor. The magnetic field transducer produces an output signal having a magnitude proportional to the magnetic field induced by an electric current in the electrical conductor.

Conventional current sensors may include a toroidal ferromagnetic body to concentrate magnetic flux produced by current in a proximate conductor. The conductor may be threaded through the toroid, which provides an increased magnetic field proximate to a magnetic field transducer, and therefore, a more sensitive device. The magnetic field transducer produces an output signal proportional to the current in the conductor.

One type of current sensor described in pending U.S. Pat. No. 7,358,724 of William P. Taylor et al., integrates a magnetic flux concentrator and a magnetic field transducer into a packaged integrated circuit. Another type of current sensor described in U.S. Pat. No. 7,265,531 to Stauth et al. includes a conductor with a notch for receiving a magnetic field transducer. Still another current sensor described in U.S. Pat. No. 6,005,383 to Savary et al. includes a magnetic circuit having a winding wound around the magnetic circuit. The magnetic circuit has an opening for a magnetic field detector which senses current through the winding.

Some current sensors sever the conductor to form an electrical connection for sensing current. For example, U.S. Pat. No. 6,177,884 to Hunt et al. describes an apparatus for severing a conductor. Other conventional current sensors, such as the current sensor described in U.S. Pat. No. 6,005,383 to Savary et al., require complicated threading or winding operations to couple the conductor to the current sensor.

SUMMARY

In accordance with the present invention, a current sensor includes a soft ferromagnetic body forming a lumen to receive an electrical conductor, the soft ferromagnetic body having first and second folding portions to enclose the conductor within the lumen and a magnetic field detector having at least a portion disposed within the first and second folding portions.

In one aspect, the invention provides a current sensor including an outer body having a first folding portion and a second folding portion coupled to the first folding portion. The current sensor also includes a soft ferromagnetic body disposed within the outer body comprising a first core element and a second core element. The first and second core elements form a lumen when the first and second folding portions are folded. The lumen is configured to receive a conductor. The current sensor also includes a magnetic field detector to sense a current in the conductor. The magnetic field detector is at least partially disposed between the folded first and second core elements.

In another aspect, the invention provides a current sensor for sensing current in at least one loop of a conductor. The current sensor includes an outer body having a first folding portion and a second folding portion, the first and second folding portions being rotatably coupled by at least one rotator element. The current sensor also includes a first core element disposed in the first folding portion of the outer body and a second core element disposed in the second folding portion of the outer body. When the first and second folding portions are folded at the rotator element, the first and second core elements form a lumen to receive the at least one loop of the conductor. The current sensor also includes a magnetic field detector disposed at least partially within the folded first and second folding portions. The magnetic field detector may be further disposed at least partially between first and second extensions of the first and second core elements, respectively, to concentrate a magnetic flux.

In another aspect, the invention includes a method comprising providing a current sensor comprising a soft ferromagnetic body having first and second folding portions, and a magnetic field detector. The method also includes folding the first and second folding portions of the soft ferromagnetic body to form a lumen to receive a conductor carrying a current and to dispose a portion of the magnetic field detector within the first and second folding portions of the soft ferromagnetic body, and sensing the current carried in the conductor.

With described arrangements, a current sensor is provided for sensing a current in a conductor. The current sensor is folded over the conductor such that the current can be sensed in the conductor without the need to sever the conductor or thread the conductor through the current sensor. The current sensor of the invention can be easily installed to sense currents in existing devices in the field by, for example, manually folding the current sensor over the device conductor. For example, an automobile mechanic or technician can fold the current sensor over a battery wire to sense the current flowing to an automobile battery.

BRIEF DESCRIPTION OF THE DRAWINGS

The foregoing features of this invention, as well as the invention itself, may be more fully understood from the following description of the drawings in which:

FIG. 5 is a perspective view of another alternate current sensor embodiment;

FIG. 6A is a perspective view of an embodiment of a magnetic field detector package of the current sensor;

FIG. 6B is a cross-sectional view of a configuration of the magnetic field detector package of FIG. 6A at reference line DD;

FIG. 6C is a cross-sectional view of an alternate configuration of the magnetic field detector package of FIG. 6A at reference line DD;

FIG. 6D is a cross-sectional view of still another alternate configuration of the magnetic field detector package of FIG. 6A at reference line DD;

DETAILED DESCRIPTION

Figure 1A:
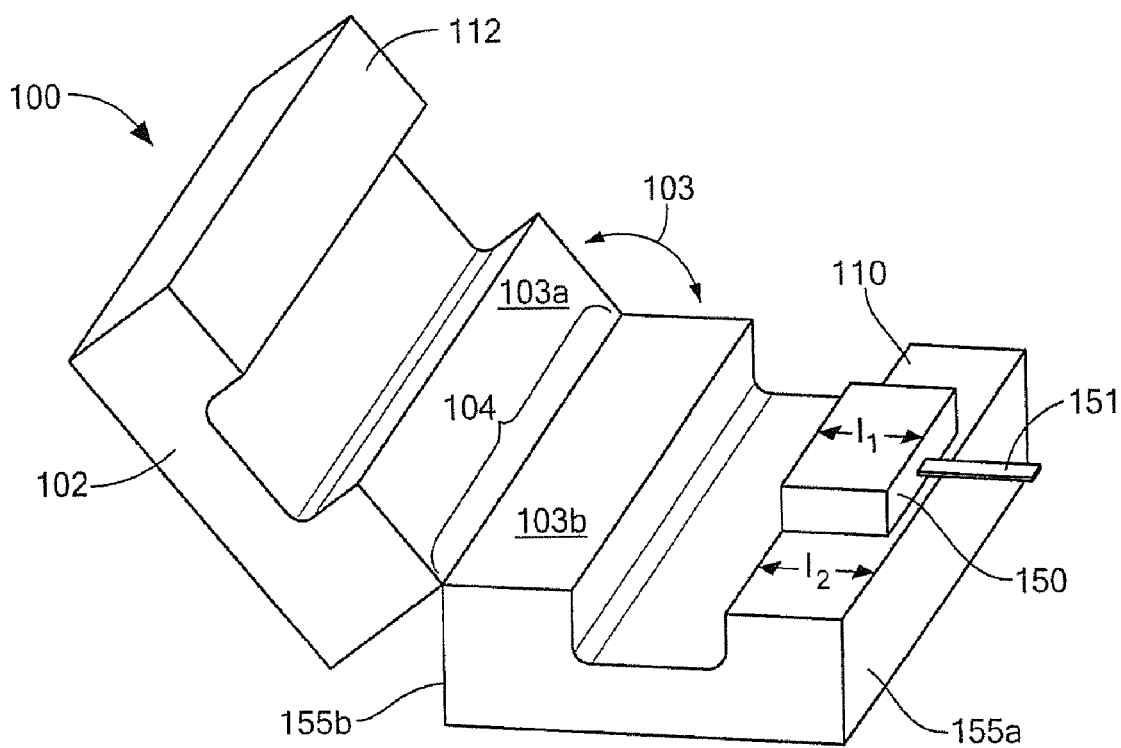
FIG. 1A is a perspective view of an embodiment of the current sensor in an unfolded position.
Figure 1B:
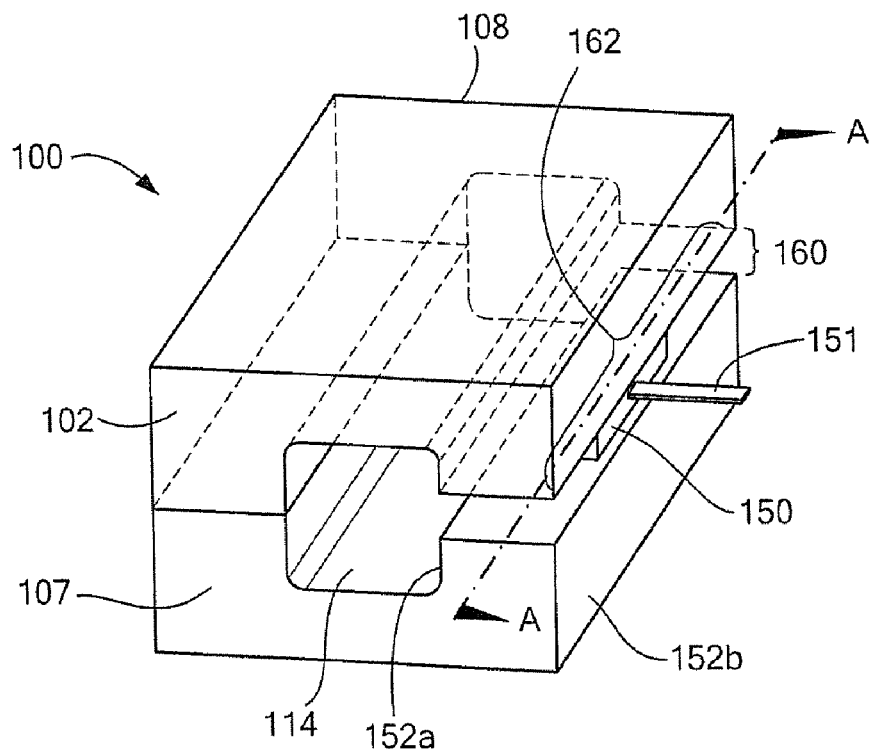
FIG. 1B is a perspective view of the current sensor in FIG. 1A in a folded position.

Referring to FIGS. 1A and 1B, a current sensor embodiment 100 of the invention includes a soft ferromagnetic body 102 having coupled first and second folding portions 110, 112. The first and second folding portions 110, 112 are adapted to form a lumen 114 when folded. A conductor can be positioned in the lumen 114 and a magnetic field detector 150 is provided to sense a current through the conductor.

As used herein, the term "folding" means rotating or pivoting coupled first and second folding portions 110, 112 toward each other. In use, the soft ferromagnetic body 102 is initially in an unfolded position, as shown in FIG. 1A such that the folding portions 110, 112 contact each other at or near a rotatable coupling 104. The soft ferromagnetic body 102 may then be folded or pivoted as shown by an arrow 103 along the rotatable coupling 104 until the first and second folding portions 110, 112 are substantially parallel to each other and form a lumen 114, as shown in FIG. 1B. The lumen 114 may extend from one end 107 of the soft ferromagnetic body 102 to the opposite end 108 of the soft ferromagnetic body 102. The lumen 114 is configured to receive a conductor (see FIGS. 2A and 2B) carrying a current to be sensed. In the folded position, preferably, the first and second folding portions 110, 112 are adjacent to each other along respective surfaces 103a, 103b to reduce the reluctance in the vicinity of the magnetic field detector.

The above-described folding of the folding portions 110, 112 is in contrast to a clamping arrangement, for example, a clamp having two clamped arms held in tight engagement by a spring such that a significant force is required to counteract the spring (such as that applied by a user's thumb and fore fingers) in order to position the conductor within the lumen. Furthermore, the significant counteracting force is applied to portions of the two clamped arms extending on a side of the spring opposite of the lumen. Also, the clamped arms are not substantially parallel when held together, instead forming a wedge.

The current sensor 100 includes a magnetic field detector 150 disposed at least partially within the first and second folding portions 110, 112. Preferably, the magnetic field detector is disposed at least partially within a side 155a of the soft ferromagnetic body opposite to the rotatably coupled side of the soft ferromagnetic body 155b. The magnetic field detector may be coupled to one of the first and second folding portions by, for example, an adhesive, solder, tape. The magnetic field detector 150 may be disposed within a gap 160 formed between the folded first and second folding portions 110, 112.

The gap 160 may include a number of various configurations depending on the current sensing application. For example, the gap 160 may extend across a longitudinal length 162 of the folded soft ferromagnetic body 102.

Figure 1C:
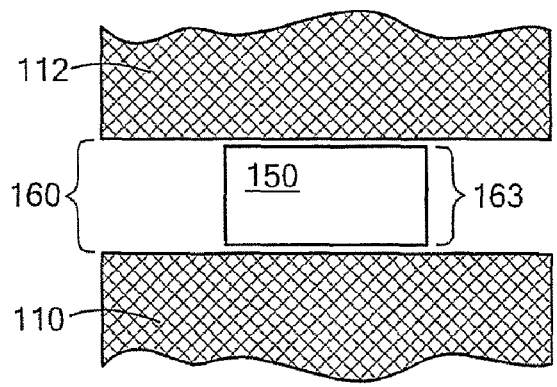
FIG. 1C is a cross-sectional view of a configuration of the current sensor embodiment of FIGS. 1A and 1B at reference line AA.

As shown in FIG. 1C, the gap 160 may have a thickness substantially equal to the magnetic field detector thickness 163, such that the rotatably-coupled first and second folding portions 110, 112 touch the magnetic field detector 150 when folded, thereby providing a lower reluctance path, when compared to air around the current-carrying conductor 105.

Figure 1D:
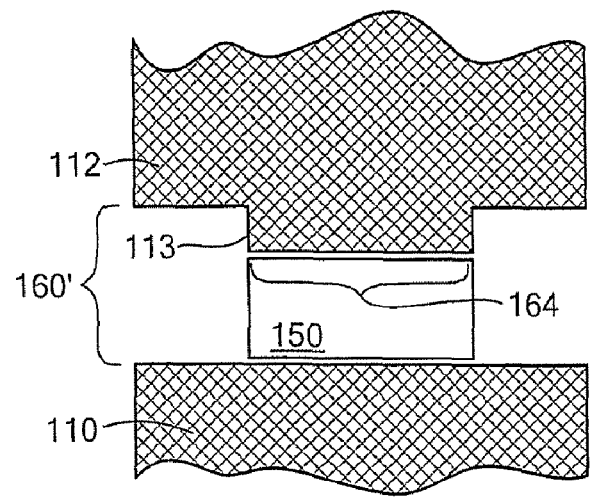
FIG. 1D is a cross-sectional view of another configuration of the current sensor embodiment of FIGS. 1A and 1B at reference line AA.

In an alternative configuration shown in FIG. 1D, one of the folding portions, for example, the second folding portion 112, has an extension 113, so as to form a gap 160' as shown. The magnetic field detector 150 may be disposed between the extension 113 and the other folding portion, for example, the first folding portion 110, such that the extension 113 further channels the magnetic flux at the location of the magnetic field detector 150. In this configuration, the width of the extension 113 may be substantially equal to the magnetic field detector width 164. In further embodiment, the extension is tapered toward the magnetic field detector 150.

Figure 1E:
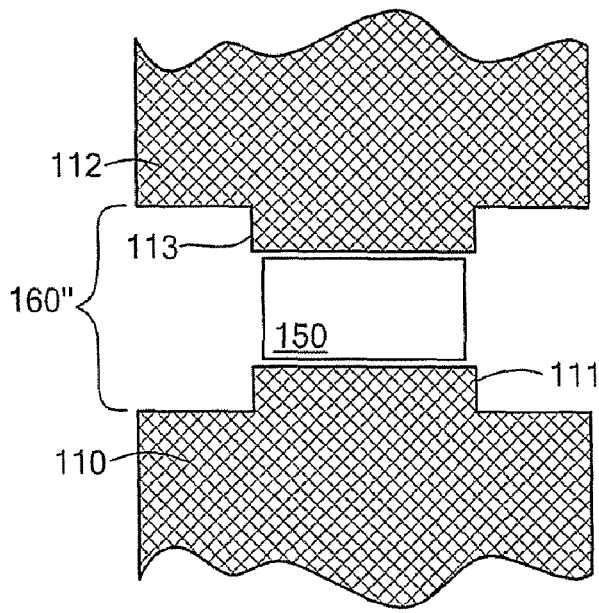
FIG. 1E is a cross-sectional view of still another configuration of the current sensor embodiment of FIGS. 1A and 1B at reference line AA.

In still another configuration shown in FIG. 1E, the first and second folding portions 110, 112 have respective first and second extensions 111, 113, forming a gap 160". The magnetic field detector 150 is disposed within the gap 160" between the first and second extensions 111, 113.

Figure 1F:
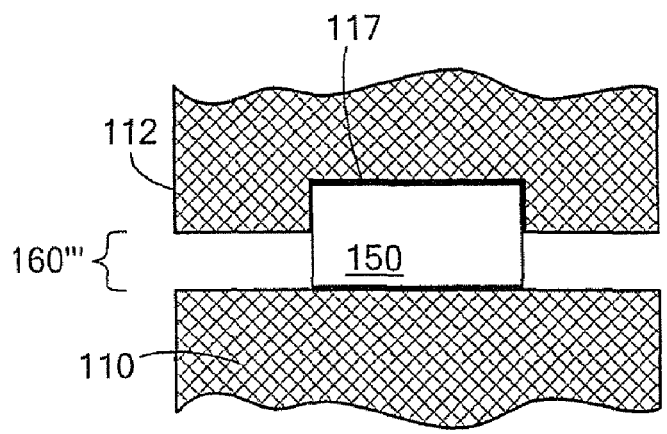
FIG. 1F is a cross-sectional view of yet another configuration of the current sensor embodiment of FIGS. 1A and 1B at reference line AA.

A further alternate configuration is shown in FIG. 1F, in which one of the folding portions, for example, the second folding position 112, has a recess 117, so as to form a gap 160''' as shown. The magnetic field detector 150 is disposed within the recess 117 and the other folding portion, for example, the first folding portion 100. The width of the recess 117 may be substantially equal to the magnetic field detector width 164. In still another configuration shown in FIG. 1G, the first and second folding portions 110, 112 have respective first and second recesses 115, 117, so as to form a gap 160''', and the magnetic field detector 150 is disposed with the first and second recesses 115, 117. Such configurations may be used to sense a particular threshold of conductor current. For example, a conductor carrying a current may produce a magnetic flux that substantially flows around the magnetic field detector 150 through the lower reluctance air gaps, 160''', 160'''', until the current reaches a particular threshold, at which point the magnetic flux begins to flow through the magnetic field detector 150, which then senses the current at the particular threshold.

Figure 1G:
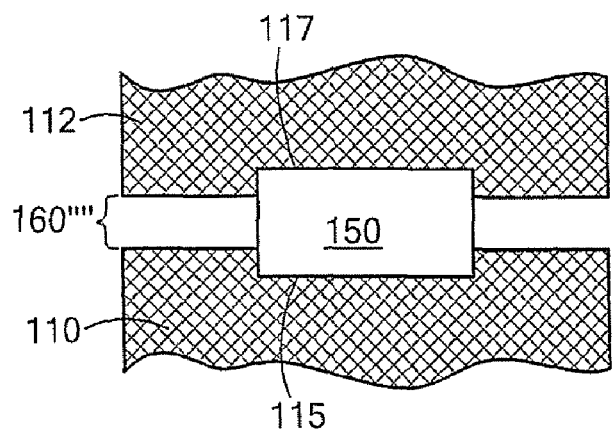
FIG. 1G is a cross-sectional view of another configuration of the current sensor embodiment of FIGS. 1A and 1B at reference line AA.
Figure 1H:
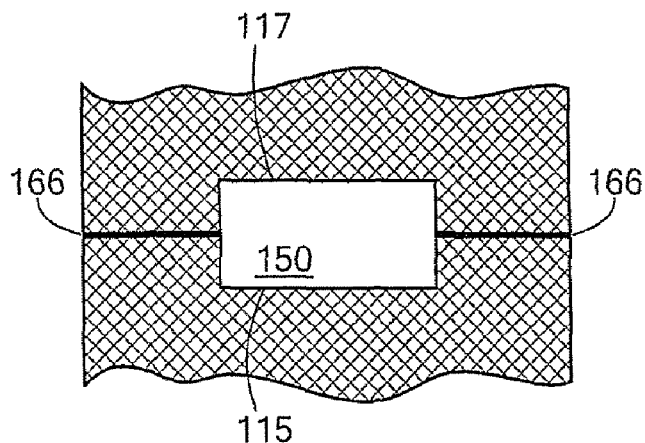
FIG. 1H is a cross-sectional view of still another configuration of the current sensor embodiment of FIGS. 1A and 1B at reference line AA.

In another configuration shown in FIG. 1H, the folded first and second folding portions 110, 112 have respective recesses 115, 117 as in the arrangement of FIG. 1G; however, in the arrangement of FIG. 1H, the first and second folding portions 110, 112 are coupled to each other at surfaces 166, as shown, and may physically contact each other. In this configuration, a current sensor can be designed to sense a current of a predetermined value. Here, the magnetic flux will tend to flow around the magnetic field detector 150 through the lower reluctance contacting surfaces of the first and second folding portions 110, 112, producing a predetermined zero-ampere-current output signal, for example 0.5 volts. Once the predetermined current level is reached, the soft ferromagnetic body 102 will become saturated, causing magnetic flux to flow through the magnetic field detector 150, producing a predetermined response in the magnetic field detector 150 and indicating that the predetermined current level has been reached.

In the illustrative embodiment of FIGS. 1A and 1B, the magnetic field detector 150 is shown to have a length "$l_1$" that is substantially the same as length "$l_2$" of the adjacent folding portion walls 152a, 152b. Stated differently, the magnetic field detector 150 extends from an inner wall 152a of the soft ferromagnetic body to an outer wall 152b thereof. It will be appreciated however that the length $l_1$ of the detector 150 may alternatively be shorter or longer than the adjacent folding portion wall length $l_2$.

Preferably, the soft ferromagnetic body 102 comprises a soft ferromagnetic material including, but not limited to, a ferrite material, steel, iron alloy, NiFeMo, Supermalloy, a nickel alloy, a cobalt alloy, and Permalloy. In embodiments in which the soft ferromagnetic body 102 is comprised of ferrite, the body may alternatively be referred to as a ferrite core.

Additionally, the soft ferromagnetic body 102 may have a variety of shapes depending on the application. For example, the soft ferromagnetic body 102 may be substantially tubular, having walls defined by the first and second folding portions 110, 112 and forming the lumen 114 when folded. Alternatively, the soft ferromagnetic body 102 may have a substantially regular-shaped cross-section. Furthermore, it will be apparent that the body 102 cross-section and the lumen 114 cross-section need not be of the same shape. For example, while the body 102 cross-section and the lumen 114 cross-section in the embodiment of FIGS. 1A and 1B are both substantially rectangular, it will be appreciated that one or the other such cross-sections may be substantially circular.

The magnetic field detector 150 includes one or more leads 151 for carrying electrical signals to and from the magnetic field detector 150. Illustrative signals carried by leads 151 include power and ground signals and an output signal of the magnetic field detector that has a signal level (e.g. a voltage level) proportional to the sensed magnetic field and thus, to the current through the conductor.

With this arrangement, the current sensor 100 is configured to sense a current in a conductor positioned within the lumen 114. The current flowing through the conductor produces a magnetic field in the vicinity of the conductor and the magnetic field detector 150. The magnetic field detector 150 responds to the magnetic field and produces an output signal that is proportional to the amount of current in the conductor.

The magnetic field detector 150 includes a magnetic field transducer that may take the form of a Hall effect element, a giant magnetoresistance element, or an anisotropic magnetoresistance element. It will be apparent to one skilled in the art that the magnetic field transducer may be positioned in a variety of ways to maximize the magnetic field transducer's output response to the magnetic flux produced by the current flowing in the conductor.

In at least one embodiment of the current sensor 100, relatively small currents can be sensed by concentrating the magnetic flux with the soft ferromagnetic body 102 at the location of the magnetic field detector 150. This may be accomplished using extended and/or tapered portions of the soft ferromagnetic body 102, which direct and focus the magnetic flux at the location of the magnetic field detector 150. The extensions 111, 113 of FIG. 1E are examples of such extended portions. Further, the extended portions may be tapered toward the magnetic field transducer to concentrate the flux further toward the magnetic field transducer.

Figure 2A:
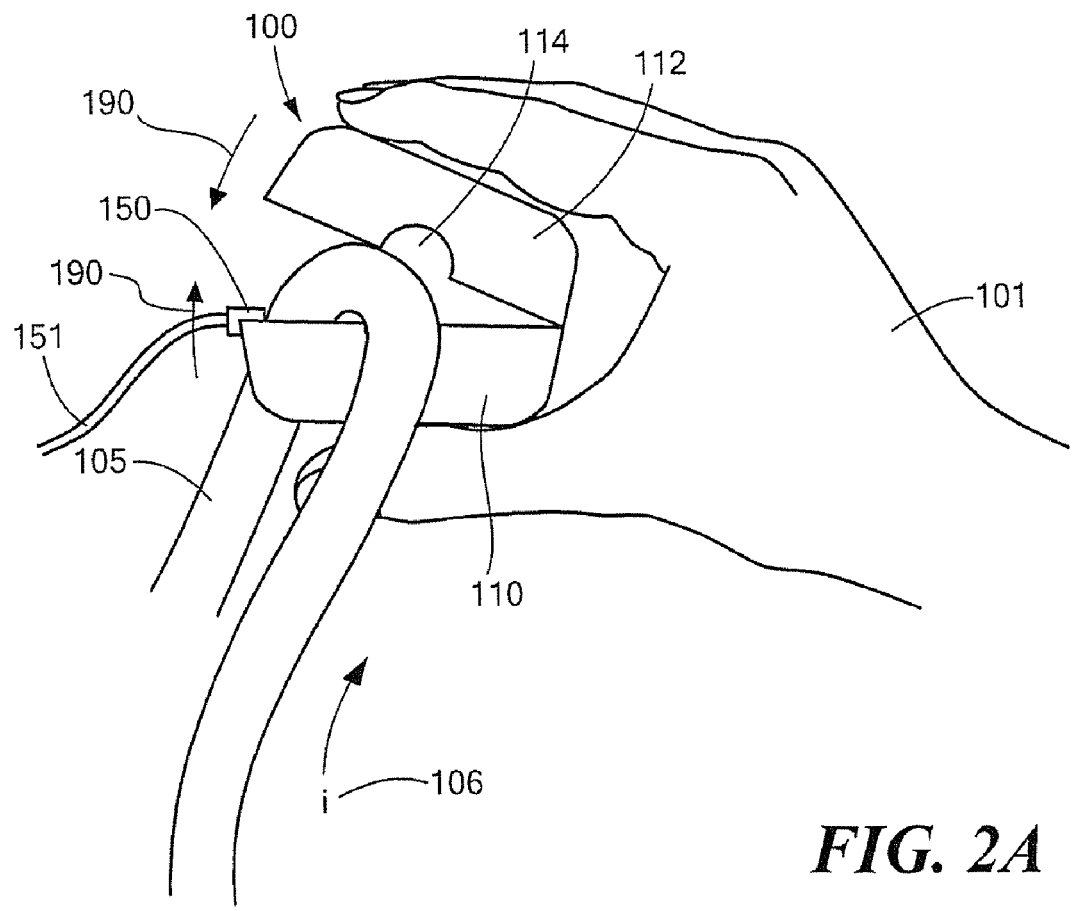
FIG. 2A is a pictorial of an embodiment of the current sensor being folded over a conductor.
Figure 2B:
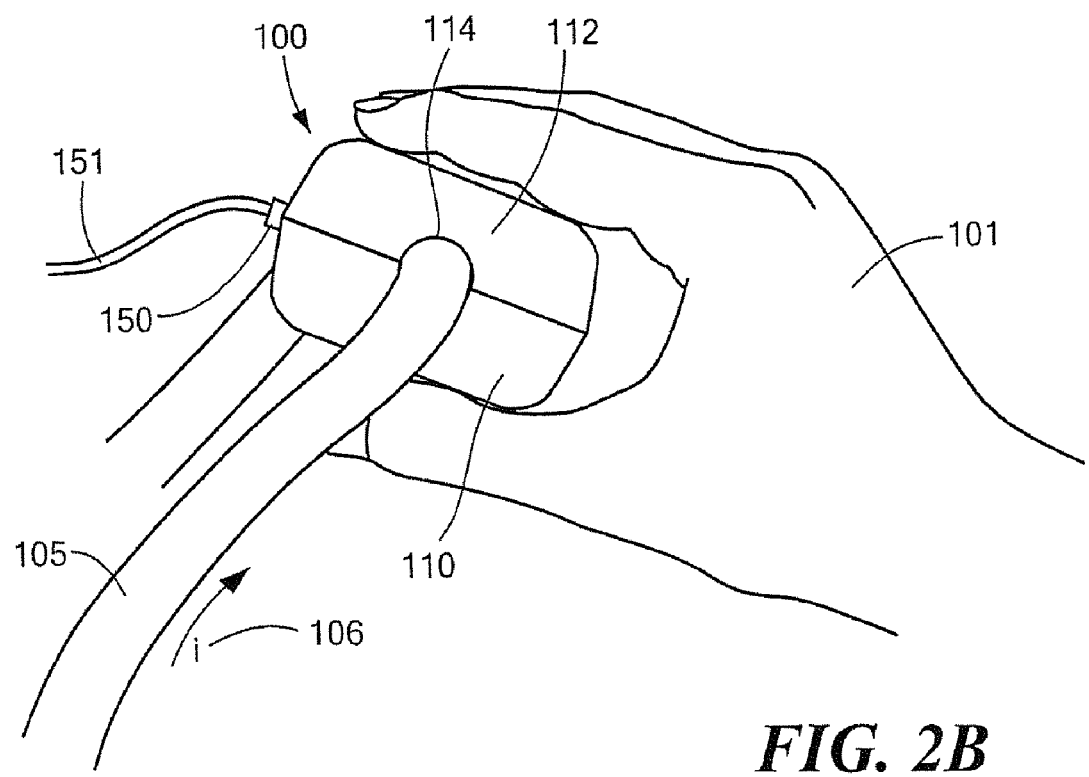
FIG. 2B is a pictorial of the current sensor embodiment of FIG. 2A connected to the conductor.

Referring to FIGS. 2A and 2B, a current sensor 100 of the invention may be installed by an operator 101 over a conductor 105 carrying a current i 106 to be sensed. The operator 101 places the unfolded first and second folding portions 110, 112 of the current sensor 100 over the conductor 105 and folds the first and second folding portions 110, 112 over the conductor 105 by moving the folding portions toward each other as indicated by arrow 190 so that the lumen 114 (formed by folded first and second folding portions 110, 112) receives the conductor 105. The folded first and second folding portions 110, 112 may be secured using any number of methods including, but not limited to, a hook-and-eye fastener wherein a hook attached to one of the folding portions is slotted through an eye attached to the other of the folding portions, tape wrapped around the folded first and second folding portions 110, 112, Velcro™, a snap fastener, etc.

In this way, the current sensor 100 can be easily installed for sensing a current 106 in the conductor 105 without the need to, for example, sever the conductor 105 or thread the conductor 105 through the current sensor 100 in a complicated fashion. For example, an automobile mechanic or technician can install the current sensor over a wire to detect currents in an automobile's electrical system. Although FIGS. 2A and 2B show an embodiment of the current sensor sized for manual installation by hand, the current sensor is not limited to this method of installation, size, and configuration. For example, a tool may be used to automatically install the current sensor over a conductor.

Furthermore, the current sensor may be miniaturized for use with very small electrical components, such as those found in an automobile interior lighting application.

Referring now to FIGS. 3A, 3B, 4A, and 4B, in one aspect, the invention provides a current sensor 300 including an outer body 301, a soft ferromagnetic body 302, and a magnetic field detector 350.

The outer body 301 has a first and second folding portion 310, 312. The first and second folding portions 310, 312 can be in an unfolded position (shown in FIGS. 3A and 3B) or a folded position (shown primarily in FIG. 4A). Preferably, the first and second folding portions 310, 312 are rotatably-coupled on one side via at least one rotator element 316. The rotator element can include, but is not limited to, a hinge, a flexible material, such as a living hinge, a bearing, tape material, etc. The first and second folding portions 310, 312 can be rotated, as shown by arrow 303, about the rotator element 316 to move between the unfolded and the folded positions.

The soft ferromagnetic body 302 has a first and second core element 320, 322. The first and second core elements 320, 322 are secured to the first and second folding portions 310, 312 of the outer body 301. For example, the first and second core elements 320, 322 may be secured using an adhesive, solder, etc.

Figure 4A:
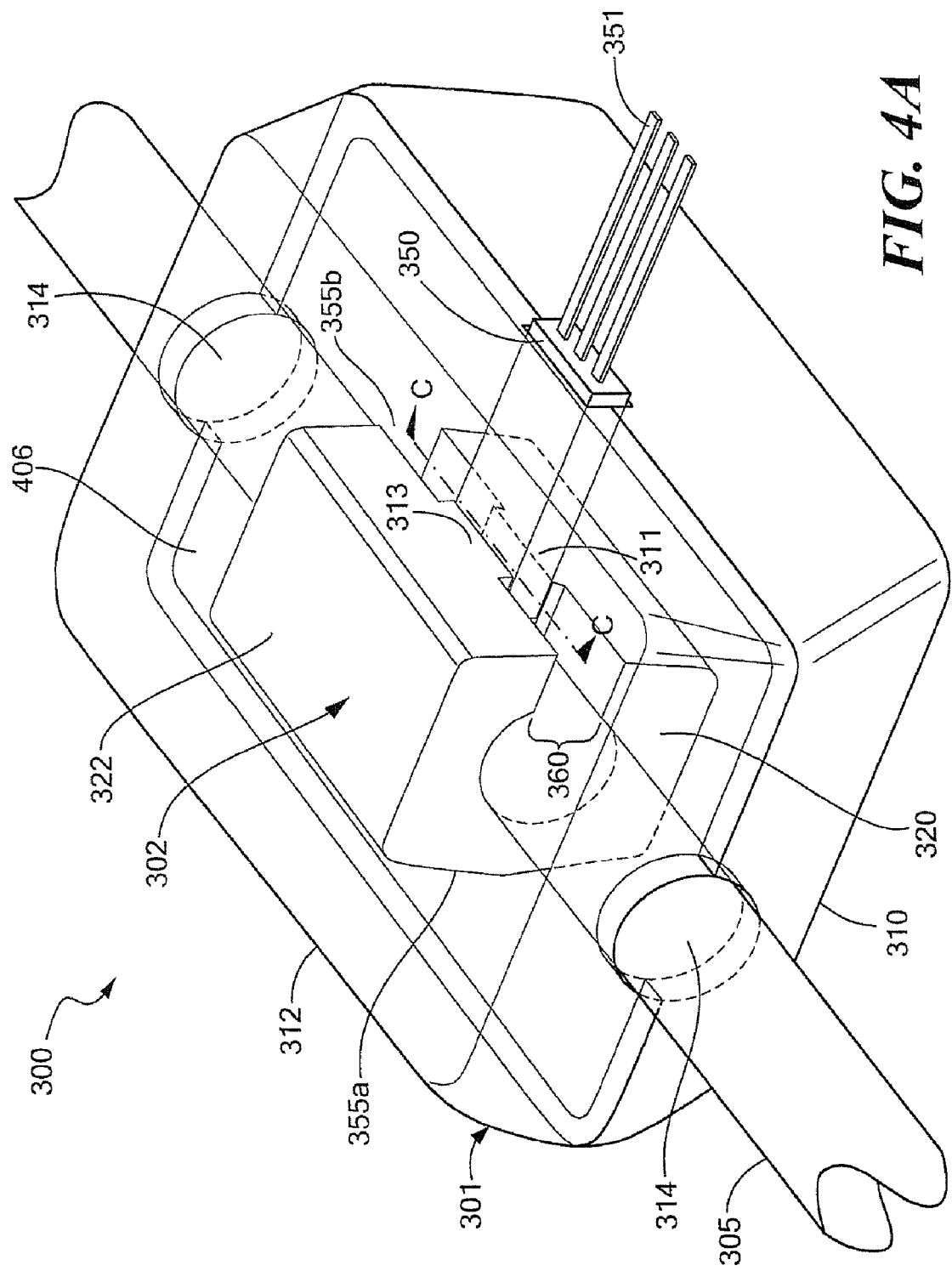
FIG. 4A is a perspective view of an alternate current sensor embodiment.

Referring to FIG. 4A, the outer body 301 may form a hollow area 406 when folded to house at least the soft ferromagnetic body 302. The hollow area 406 may further house other elements of the current sensor.

The outer body 301 may comprise a material, for example, a plastic molded material appropriate for the current sensor application. For example, in a high temperature/high mechanical stress environment, such as an automotive environment, a high temperature molding material may be used to produce a high temperature resistant/high mechanical stress resistant outer body.

Referring again to FIG. 4A, when the current sensor 300 is in the folded position, the first and second folding portions 310, 312 are substantially parallel to each other. Also, the first and second core elements 320, 322 are substantially parallel to each other and are adjacent to each other on the rotatably coupled side 355a of the folded soft ferromagnetic body 302. In a further embodiment, the first and second core elements 320, 322 contact each other on the rotatably coupled side 355a of the folded soft ferromagnetic body 302.

When the current sensor is in the folded position, the core elements 320, 322 form a lumen 314 for receiving a conductor 305. The lumen may be formed by one or more cutout longitudinal portions 314', 314" (shown in FIG. 3B) of the outer body 301 and soft ferromagnetic body 302.

The magnetic field detector 350 may be disposed in a gap 360 formed by folded first and second core elements 320, 322 of the soft ferromagnetic body 302. The gap 360 may extend across the entire longitudinal length of the folded first and second core elements 320, 322. In another embodiment, a portion of the folded first and second core elements 320, 322 contact each other on a side 355b of the soft ferromagnetic body 302 opposite to the rotatably coupled side 355a of the soft ferromagnetic body 302.

In a further embodiment of the current sensor, the magnetic field detector may be disposed in a gap formed by folded first and second folding portions 310, 312 of the outer body 301. The magnetic field detector 350 may include one or more leads 351 for coupling signals to and from the magnetic field detector 350.

Figure 4B:
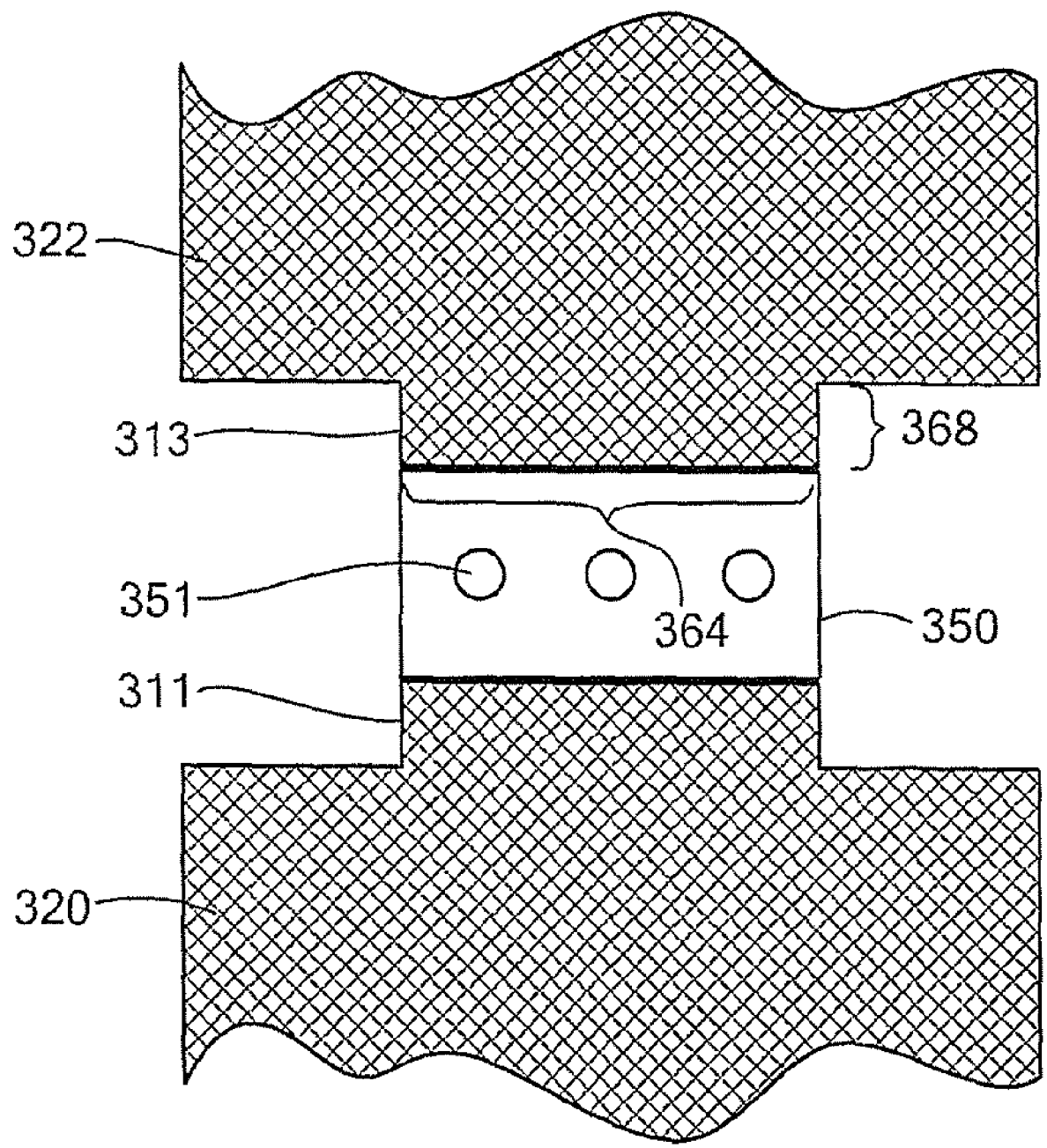
FIG. 4B is a cross-sectional view of the current sensor embodiment of FIG. 4A at reference line CC.

Referring to FIG. 4B, in at least one embodiment of the current sensor 300, the first and second core elements 320, 322 have respective first and second extensions 311, 313. The first and second extensions 311, 313 further channel the magnetic flux proximate to the magnetic field detector 350. The first and second extensions 311, 313 may extend beyond the first and second core elements 320, 322 by a thickness 368. The first and second extensions 311, 313 need not have the same thickness. Also, first and second extensions 311, 313 may extend along the soft ferromagnetic body 302 by a longitudinal length 364. The first and second extensions 311, 313 need not have the same longitudinal length. Also, the longitudinal length 364 may be substantially equal to the width of the magnetic field detector 350.

It should be noted that although FIGS. 4A and 4B show a current sensor 300 having first and second extensions 311, 313 on respective first and second core elements 320, 322, in an alternative embodiment, only one of core elements has an extension. For example, the first core element 320 may have an extension 311, whereas the second core element 322 has no extension. In such an embodiment, the magnetic field detector 350 is disposed at least partially between the extension 311 and the second core element 322.

Referring now to FIG. 5, in one aspect, the invention provides a current sensor 500 for detecting the current flowing through at least one loop 570 of a conductor 505. The current sensor 500 includes an outer body 501 having a first and second folding portion 510, 512, and a ferromagnetic body 502 having a first and second core element 520, 522. Also, the first core element 520 has a extension 511. The extension 511 is shown to have a length "$l_3$" that is less than length "$l_2$" of the adjacent folding portion walls 552a, 552b. It will be appreciated however that the length $l_3$ may be substantially equal to length $l_2$ of adjacent folding portion walls 552a, 552b.

The current sensor includes a magnetic field detector 550 disposed at least partially within the outer body 501 and the soft ferromagnetic body 502 as further described below. The length $l_3$ of extension 511 may be reduced to further concentrate the magnetic flux in the area of the magnetic field detector 550.

The first and second folding portions 510, 512 of the outer body 501 are rotatably-coupled by at least one rotator element 516. When in the folded position, the outer body forms a hollow area 506 for housing the soft ferromagnetic body 502 and any other current sensor components. When the current sensor 500 is folded, the first and second folding portions 510, 512 and first and second core elements 520, 522 form a lumen (not shown) for receiving the at least one loop 570 of the conductor 505. The lumen is formed by cutout portions 514 of one or both of the outer body 501 and the soft ferromagnetic body 502. The size of the lumen may depend on factors such as the wire gauge of the conductor and the desired number of loops. For example, a lower wire gauge or a higher number of loops will require a larger lumen.

The first and second core elements 520, 522 are disposed in the outer body 501. Preferably, the first core element 520 is disposed in the first folding section 510 and the second core element 522 is disposed in the second folding section 512. The first and second core elements 520, 522 preferably contact each other on one side when the current sensor 500 is fully folded. On the opposite side of the ferromagnetic body 502, the first and second core elements 520, 522 form a longitudinal gap that extends at least partially along the longitudinal length of the soft ferromagnetic body 502. Preferably, the extension 511 protrudes into the longitudinal gap such that, when the current sensor 500 is fully folded, the magnetic field detector 550 is disposed at least partially between the extension 511 and the second core element 522.

With this arrangement, a current flowing through the at least one loop 570 of the conductor 505 can produce a magnetic flux in the soft ferromagnetic body 502. The magnetic flux in the soft ferromagnetic body 502 is concentrated by the extension 511 nearby the magnetic field detector 550. The magnetic field detector 550 senses the concentrated magnetic flux and can produce an output signal proportional to the current.

In one configuration of the current sensor 500, the hollow area 506 may extend longitudinally across the outer body 501. In such a configuration, a loop of the conductor 570 may be disposed within the hollow area 506 and, more particularly, within an enclosing one of the first and second folding portions 510, 512 of the outer body 501. Further, the enclosing folding portion may further include a protrusion extending into the hollow area 506 to secure the loop of the conductor 570 to the outer body 501.

In at least one embodiment of the invention, the magnetic field detector 550 is flush-mounted with respect to the outer body 510 of the current sensor 500. Referring again to FIG. 5, the magnetic field detector 550 includes at least one bent lead 551 to minimize the extension of leads beyond the outer body 501 of the current sensor 500. For example, the at least one magnetic field detector lead 551 may be down-turned so as to not extend far beyond the outer body 501 of the current sensor 500. Preferably, the at least one lead 551 is bent in two places 581, 582, producing an s-shaped profile, so that both the current sensor 500 and the at least one lead 551 can be easily coupled to a device.

For example, the outer body 501 of the current sensor 500 and at least one lead 551 may be coupled to a printed circuit board (PCB). Using surface-mounting technology, the outer body 501 may be surface-mounted to the PCB and at least one bend lead 551 may be soldered to the PCB. Alternatively, the outer body 501 of the current sensor 500 can be connected to a PCB by the use of through-holes or via a connector or socket mounted to the PCB.

Referring again to FIG. 5, in one embodiment of the invention, the at least one loop of the conductor 570 includes at least two loops. A higher number of loops will tend to increase the sensitivity of the current sensor 500, for example, to detect very small currents in the conductor 505. The lumen 514 is sized appropriately for the expected magnetic flux based on the wire gauge and number of wire loops, an current levels to be sensed.

Referring to FIGS. 6A-6D, in at least one embodiment of the current sensor, the magnetic field detector (e.g., detector 150 of FIG. 1A or detector 350 of FIG. 3A) is provided in a package 600 including a magnetic field transducer 650 and a magnetic field concentrator 611. The magnetic field detector package 600 can include a package substrate 680 for supporting other components, and may be disposed on a base plate 690. Although not shown in FIG. 6A for simplicity of illustration, the package 600 may include a plastic overmold to encapsulate the detector components.

Referring to FIG. 6B, the magnetic field concentrator 611 may be positioned directly over the magnetic field transducer 650. Preferably however, an insulation layer 652 intervenes at least partially between the magnetic field transducer 650 and the magnetic concentrator 611, as shown in the configuration of FIG. 6C. The insulator layer 652 can provide insulation between the package elements.

The magnetic field detector package 600 can include two magnetic field concentrators 611 positioned in various configurations. For example, as shown in FIG. 6C, the magnetic field detector package 600 can include a concentrator 611, insulator layer 652, base plate 690, optional substrate 680, magnetic field transducer and/or circuit elements 650, a second insulator layer 652, and a second concentrator 611. The magnetic field detector package 600 may be further overmolded with a material such as an epoxy mold compound.

Referring to FIG. 6D, the magnetic field concentrator 611 and package layer 652 may at least partially surround the magnetic field transducer 650.

Figure 3A:
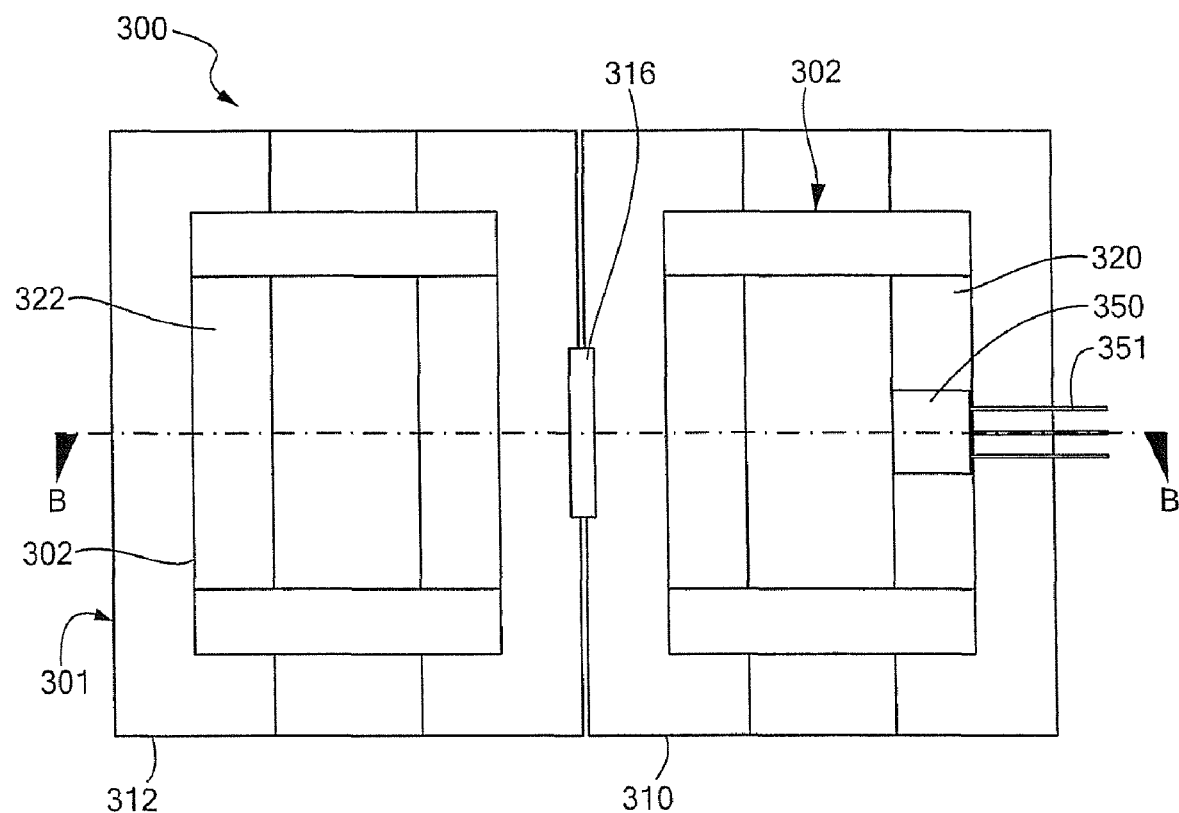
FIG. 3A is a top view of an alternate embodiment of the current sensor.
Figure 3B:
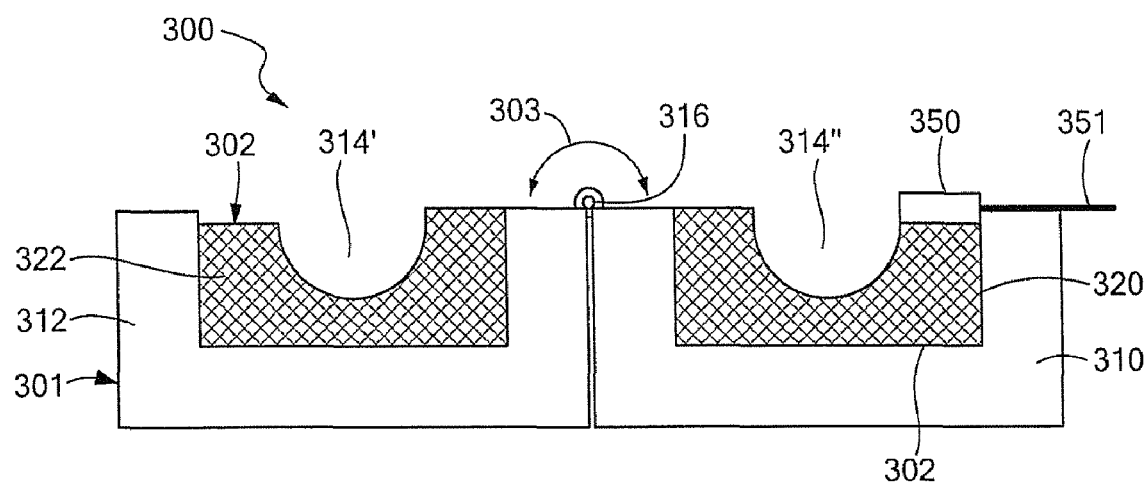
FIG. 3B is a cross-sectional view of the current sensor embodiment of FIG. 3A at reference line BB.

The magnetic field concentrator 611 in the magnetic field detector package 600 provides a level of magnetic flux concentration in addition to the soft ferromagnetic body (e.g., 102 of FIG. 1A. or 302 of FIG. 3A). The magnetic field concentrator 611, therefore, can increase the sensitivity of the current sensor. With this configuration, very small magnitude currents can be sensed in the conductor.

Additional configurations of magnetic field concentrators incorporated within a magnetic field detector package are described in U.S. Pat. No. 7,358,724, which application is hereby incorporated herein by reference in its entirety.

Figure 7A:
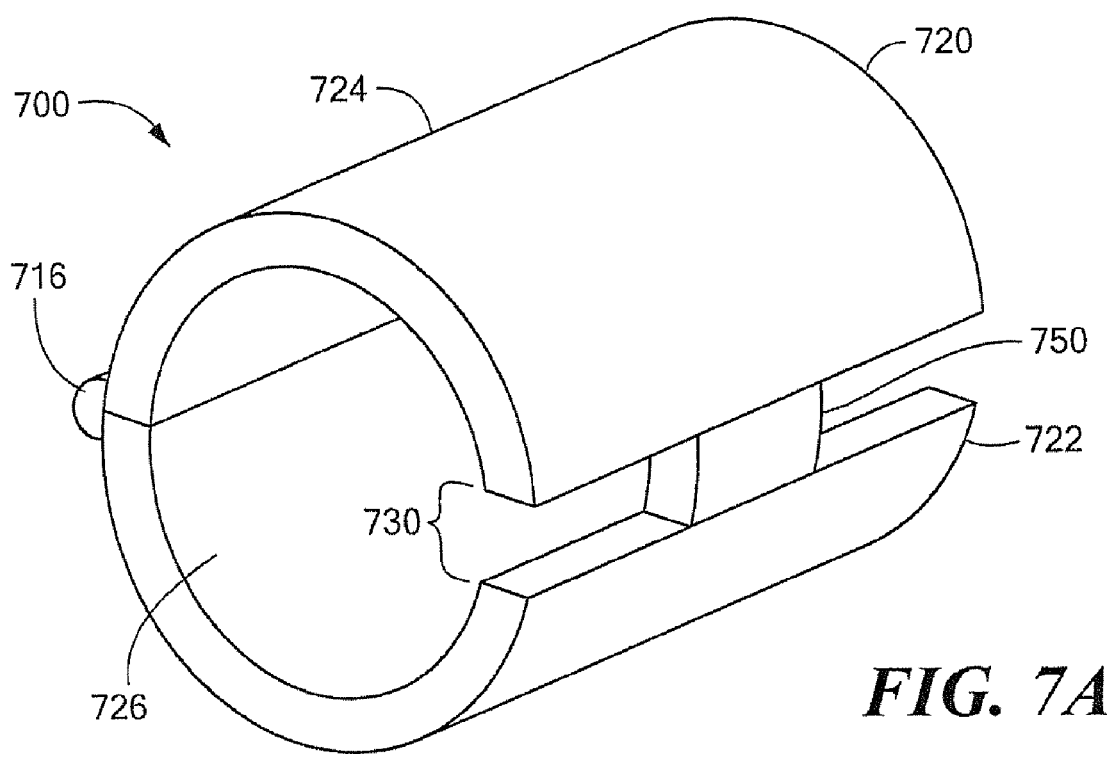
FIG. 7A is a perspective view of an embodiment of a ferromagnetic body of the current sensor in the form of a ferrite tube.
Figure 7B:
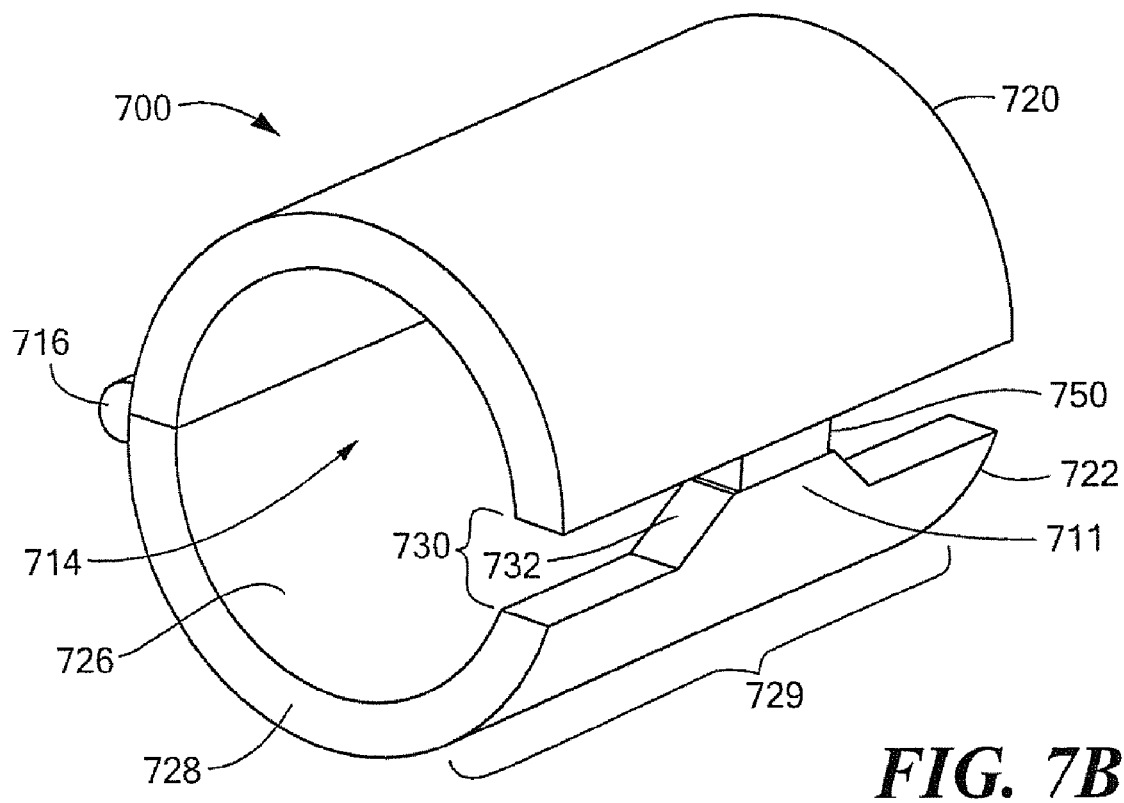
FIG. 7B is a perspective view of an alternate embodiment of a ferrite tube ferromagnetic body of the current sensor.
Figure 7C:
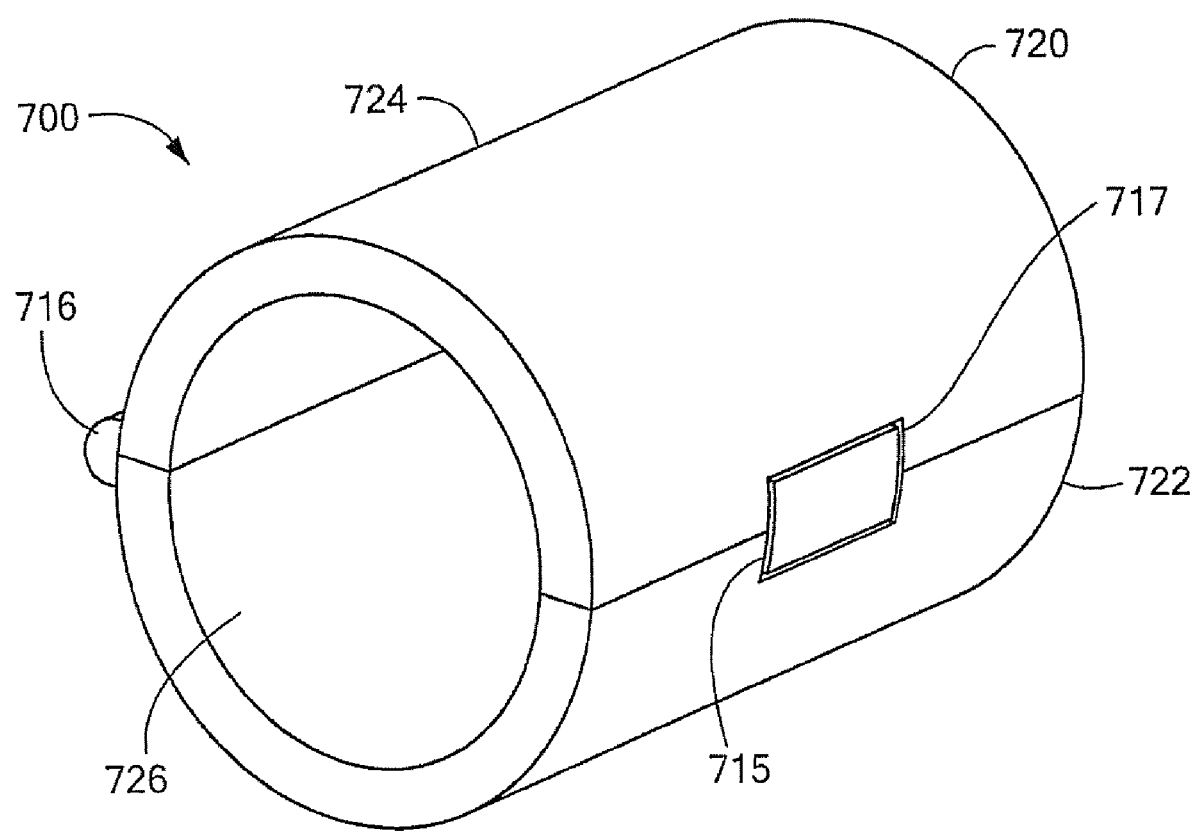
FIG. 7C is a perspective view of yet another embodiment of a ferrite tube ferromagnetic body of the current sensor.

Referring to FIGS. 7A-7C, in at least one embodiment of the current sensor 700, the soft ferromagnetic body 700 is provided in the form of a tube having an outer surface 724 coupled to an outer body (e.g., outer body 501 of FIG. 5). The tube 700 has an inner surface 726. The inner surface forms the lumen 714 of the current sensor and thus, is adapted to receiver a conductor. As shown in FIG. 7B, the outer and inner surfaces 724, 726 define a wall 728 along the length 729 of the tube 700.

The tube 700 has first and second core elements 720, 722. Preferably, the folded first and second core elements 720, 722 are coupled by at least one rotator element 716. The tube 700 has a c-shaped cross section, such that the folded first and second core elements 720, 722 form a longitudinal gap 730.

In this configuration, the magnetic field detector 750 is disposed in the longitudinal gap 730.

In a further embodiment of the current sensor shown in FIG. 7B, an extension 711 of the first core element 720 protrudes into the longitudinal gap 730 and is tapered 732, i.e. reduced in width, toward of the magnetic field detector 750.

In a further embodiment of the tube 700 shown in FIG. 7C, the folded first and second core elements 720, 722 are in contact on both sides of the tube and the magnetic field detector 750 is disposed in first and second recesses 715, 717 of the respective first and second core elements 720, 722. In this configuration, the magnetic flux will tend to flow around the magnetic field detector 750 because of the reduced reluctance at the contacting portions of the tube 700. However, as the current in the conductor increases, the tube eventually becomes saturated and the magnetic flux will begin to flow through and be sensed by the magnetic field detector 750. In this way, the current sensor can be configured as a current threshold sensor as described above in connection with FIG. 1H.

In one aspect, the invention includes a method comprising providing a current sensor including a soft ferromagnetic body having first and second folding portions, and a magnetic field detector having at least a portion disposed within the first and second folding portions of the soft ferromagnetic body. The method also includes folding the first and second folding portions of the soft ferromagnetic body to form a lumen to receive a conductor carrying a current, and sensing the current carried in the conductor.

In a further embodiment of the method, the current sensor further comprises a rotator element to rotatably couple the first and second folding portions of the soft ferromagnetic body, wherein folding further includes rotating the first and second folding portions at the rotator element until the portion of the magnetic field detector is disposed on a side of the soft ferromagnetic body opposing the rotator element.

In another embodiment of the method, the current sensor further comprises a rotator element to rotatably couple the first and second folding portions of the soft ferromagnetic body and the current sensor is initially in an open position wherein the first and second folding portions are not held in contact on a side of the soft ferromagnetic body opposing the rotator element. In this embodiment, folding further includes rotating the first and second folding portions at the rotator element, wherein the portion of the magnetic field detector is disposed on the side of the soft ferromagnetic body opposing the rotator element.

In another embodiment, the method further comprises securing the folded first and second folding portions with a securing body. The securing body may be, for example, a band having a first and second end, wherein the band is wrapped around the folded first and second folding portions and the first and second ends are secured to each other. In one configuration, the band may be a belt comprising a buckle on one end threaded through a hole in the other end. In another configuration, the band may be a loop tie wherein one end is threaded through a loop in the other end and pulled through the loop until securely fastened to the folded first and second portion.

In another configuration of the current sensor, one of the first and second folding portions may be coupled laterally to a loop body having a lumen, wherein a band is looped through the loop body's lumen, wrapped around an adjacent conductor disposed in the lumen formed by the folded first and second folding portions, and tightened to secure the conductor to the loop body.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A current sensor comprising: a soft ferromagnetic body forming a lumen configured to receive a conductor, the soft ferromagnetic body having first and second folding portions configured to fold, unfold, and to enclose the conductor within the lumen; and a magnetic field detector having at least a portion disposed within a gap extending along at least a portion of a longitudinal length of the soft ferromagnetic body when the first and second folding portions are folded, a first surface of the magnetic field detector in contact with a surface of a first extension of the first folding portion, the first extension extending from a longitudinal surface of the first folding portion within the gap leaving an area of the longitudinal surface of the first folding portion within the gap uncovered, and a second surface of the magnetic field detector opposing the first surface of the magnetic field detector in contact with a surface of a second extension of the second folding portion, the second extension extending from a longitudinal surface of the second folding portion within the gap leaving an area of the longitudinal surface of the second folding portion within the gap uncovered.

2. The current sensor of claim 1, further comprising a rotator element to rotatably couple the first and second folding portions of the soft ferromagnetic body, wherein the portion of the magnetic field detector is disposed within a side of the soft ferromagnetic body opposite to the rotator element.

3. The current sensor of claim 1, wherein a recess is formed in one of the folding portions and the magnetic field detector has at least a portion disposed between the recess and the other of the folding portions.

4. The current sensor of claim 1, wherein the first folding portion is adjacent to the second folding portion in an area adjacent to the magnetic field detector when the conductor is enclosed in the lumen.

5. The current sensor of claim 1, wherein a first recess is formed in the first folding portion, a second recess is formed in the second folding portion, and the magnetic field detector has at least a portion disposed within the first and second recesses.

6. The current sensor of claim 1, wherein the magnetic field detector comprises: a magnetic field transducer; and a magnetic field concentrator in proximity to the magnetic field transducer.

7. The current sensor of claim 1, wherein a width of the first extension is equal to a width of the magnetic field detector and a width of the second extension is equal to the width of the magnetic field detector.

8. The current sensor of claim 1, wherein the first extension tapers towards the magnetic field detector and the second extension tapers towards the magnetic field detector.

9. A current sensor comprising: an outer body having a first folding portion and a second folding portion configured to fold and unfold, wherein the second folding portion is coupled to the first folding portion; a soft ferromagnetic body disposed within the outer body and comprising a first core element and a second core element, the first and second core elements forming a lumen when the first and second folding portions are folded, the lumen configured to receive a conductor; and a magnetic field detector to sense a current in the conductor, the magnetic field detector having at least a portion disposed between the first and second core elements in a gap extending along at least a portion of a longitudinal length of the soft ferromagnetic body when the first and second folding portions are folded, a first surface of the magnetic field detector in contact with a surface of a first extension of the first core element, the first extension extending from a longitudinal surface of the first core element within the gap leaving an area of the longitudinal surface of the first core element within the gap uncovered, and a second surface of the magnetic field detector opposing the first surface of the magnetic field detector in contact with a surface of a second extension of the second core element, the second extension extending from a longitudinal surface of the second core element within the gap leaving an area of the longitudinal surface of the second core element within the gap uncovered.

10. The current sensor of claim 9, further comprising a rotator element to rotatably couple the first and second folding portions of the outer body.

11. The current sensor of claim 10, wherein the portion of the magnetic field detector is disposed in a side of the soft ferromagnetic body opposite to the rotator element.

12. The current sensor of claim 9, wherein the soft ferromagnetic body comprises a material selected from the group consisting of a ferrite material, steel, iron alloy, NiFeMo, Supermalloy, a nickel alloy, a cobalt alloy, and Permalloy.

13. The current sensor of claim 9, wherein at least one of the first and second extensions is tapered in a direction towards the magnetic field detector.

14. The current sensor of claim 9, wherein a recess is formed in one of the folding portions and the magnetic field detector has at least a portion disposed between the recess and the other of the folding portions.

15. The current sensor of claim 9, wherein a first recess is formed in the first core element and a second recess is formed in the second core element, and the magnetic field detector has at least a portion disposed within the first and second recesses.

16. The current sensor of claim 9, wherein the magnetic field detector comprises: a magnetic field transducer; and at least one magnetic field concentrator in proximity to the magnetic field transducer.

17. The current sensor of claim 16, wherein the magnetic field transducer is one of a Hall effect element, a giant magnetoresistance element, or an anisotropic magnetoresistance element.

18. The current sensor of claim 9, wherein the magnetic field detector comprises a package comprising:
   a magnetic field transducer; and
   a magnetic field concentrator comprised of a soft magnetic material and positioned in proximity to the magnetic field transducer.

19. The current sensor of claim 18, wherein the package further comprises:
   a insulator layer disposed between the magnetic field transducer and the magnetic field concentrator.

20. The current sensor of claim 9, wherein the magnetic field detector is flush-mounted with respect to the outer body and comprises at least one bent lead.

21. The current sensor of claim 9, wherein the conductor comprises at least one loop.

22. The current sensor of claim 9, wherein the soft ferromagnetic body is a tube having an outer surface coupled to the outer body, and an inner surface forming the lumen, the outer and inner surfaces defining a wall of the tube along a length of the tube, the first and second core elements coupled along the wall adjacent to at least one rotator element when the first and second core elements are folded.

23. The current sensor of claim 22, wherein the tube has a c-shaped cross-section such that the first and second core elements are not in contact along the wall of the tube opposing the at least one rotator element.

24. The current sensor of claim 22, wherein the first and second core elements are in contact along at least one portion of the wall of the tube opposing the at least one rotator element.

25. A method comprising:
providing a soft ferromagnetic body having first and second folding portions configured to fold and unfold and a magnetic field detector coupled to one of the first and second folding portions;
folding the first and second folding portions of the soft ferromagnetic body to form a lumen to receive a conductor carrying a current and to form a gap extending along at least a portion of a longitudinal length of the soft ferromagnetic body, wherein at least a portion of the magnetic field detector is disposed within the gap, a first surface of the magnetic field detector in contact with a surface of a first extension of the first folding portion, the first extension extending from a longitudinal surface of the first folding portion within the gap leaving an area of the longitudinal surface of the first folding portion within the gap uncovered, and a second surface of the magnetic field detector opposing the first surface of the magnetic field detector in contact with a surface of a second extension of the second folding portion, the second extension extending from a longitudinal surface of the second folding portion within the gap leaving an area of the longitudinal surface of the second folding portion within the gap uncovered; and sensing the current carried in the conductor with the magnetic field detector.

26. The method of claim 25, further comprising rotatably coupling the first and second folding portions of the soft ferromagnetic body, wherein folding further comprises rotating the first and second folding portions until the portion of the magnetic field detector is disposed on a side of the soft ferromagnetic body opposing the rotator element.

27. The method of claim 26, further comprising securing the folded first and second folding portions with a securing body.

* * * * *

UNITED STATES PATENT AND TRADEMARK OFFICE
CERTIFICATE OF CORRECTION

| | | |
|---|---|---|
| PATENT NO. | : 7,936,164 B2 | Page 1 of 1 |
| APPLICATION NO. | : 12/167681 | |
| DATED | : May 3, 2011 | |
| INVENTOR(S) | : Michael Doogue et al. | |

It is certified that error appears in the above-identified patent and that said Letters Patent is hereby corrected as shown below:

Column 4, line 11 delete "solder, tape" and replace with --solder or tape.--.

Column 4, line 34 delete "embodiment," and replace with --embodiments,--.

Column 7, line 51 delete "of core" and replace with --of the core--.

Column 7, line 63 delete "a extension 511." and replace with --an extension 511--.

Column 9, line 11 delete ", an" and replace with --, and--.

Column 9, line 66 delete "cross section," and replace with --cross-section,--.

Column 10, line 6 delete ", toward of the" and replace with --, toward the--.

Column 12, line 54 delete "a insulator" and replace with --an insulator--.

Column 14, line 18 delete "Claim 26," and replace with --Claim 25,--.

Signed and Sealed this
Twelfth Day of July, 2011

David J. Kappos
*Director of the United States Patent and Trademark Office*